(12) United States Patent
Okamura et al.

(10) Patent No.: US 7,178,090 B2
(45) Date of Patent: Feb. 13, 2007

(54) ERROR CORRECTION CODE DECODING DEVICE

(75) Inventors: Toshihiko Okamura, Tokyo (JP); Hiroaki Anada, Tokyo (JP)

(73) Assignee: NEC Corporation, Tokyo (JP)

( * ) Notice: Subject to any disclaimer, the term of this patent is extended or adjusted under 35 U.S.C. 154(b) by 562 days.

(21) Appl. No.: 10/293,308

(22) Filed: Nov. 14, 2002

(65) Prior Publication Data

US 2003/0093753 A1 May 15, 2003

(30) Foreign Application Priority Data

Nov. 15, 2001 (JP) .............................. 2001-350018

(51) Int. Cl.
*H03M 13/45* (2006.01)
(52) U.S. Cl. .................................................... 714/780
(58) Field of Classification Search ................ 714/755, 714/780
See application file for complete search history.

(56) References Cited

U.S. PATENT DOCUMENTS

| | | | | |
|---|---|---|---|---|
| 6,381,728 B1 * | 4/2002 | Kang | .......................... | 714/781 |
| 6,434,203 B1 * | 8/2002 | Halter | ......................... | 375/341 |
| 6,452,979 B1 * | 9/2002 | Ariel et al. | .................. | 375/265 |
| 6,563,877 B1 * | 5/2003 | Abbaszadeh | ................ | 375/242 |
| 6,754,290 B1 * | 6/2004 | Halter | ......................... | 375/340 |
| 6,813,743 B1 * | 11/2004 | Eidson | ....................... | 714/795 |
| 6,829,313 B1 * | 12/2004 | Xu | .............................. | 375/341 |

FOREIGN PATENT DOCUMENTS

| | | |
|---|---|---|
| JP | 2001-267937 A | 9/2001 |
| JP | 2002-314437 A | 10/2002 |
| WO | WO 00/52833 A1 | 9/2000 |

OTHER PUBLICATIONS

C. Berrou et al., "Near Shannon Limit Error—Correcting Coding and Decoding : Turbo-Codes(1)", Proceedings of IEEE International Conference of Communications, (1993), pp. 1064-1070 with Abstract.

L.R. Bahl et al., "Optimal Decoding of Linear Codes for Minimizing Symbol Error Rate", IEEE Transactions on Information Theory, (Mar. 1974), pp. 284-287 with Abstract.

(Continued)

*Primary Examiner*—Stephen M. Baker
(74) *Attorney, Agent, or Firm*—Sughrue Mion, PLLC (57) ABSTRACT

In an error correction code decoding apparatus, utilized in the decoding of turbo codes, plural number of backward processing modules 100, 110 and 120 are provided. In one backward processing module, received data and a priori information are periodically read in the reverse order from memories 140 and 150 to calculate backward values. The other backward processing modules are supplied with received data and the a priori information, output from the preset other backward processing module to calculate backward values. The backward processing module reading in from the memories is cyclically changed. A forward processing and soft-output generating module 130 generates a soft-output by exploiting the backward values calculated by the backward processing module which lies directly ahead of the backward processing module reading in the data from the memories.

7 Claims, 8 Drawing Sheets

OTHER PUBLICATIONS

P. Robertson et al., "A Comparison of Optimal and Sub-Optimal MAP Decoding Algorithms Operating in the Log Domain", Proceedings of IEEE International Conference of Communications,(1995), pp. 1009-1013 with Abstract.

S. Benedetto et al., "Soft-Output Decoding Algorithms for Continuous Decoding of Parallel Concatenated Convolutional Codes", Proceedings of IEEE International Conference on Communications, (1996), pp. 112-117 with Abstract.

A. Viterbi, "An Intuitive Justification and a Simplified Implementation of the MAP Decoder for Convolutional Codes", IEEE Journal on Selected Areas in Communications, vol. 16, No. 2, (Feb. 1998), 260-264 with Abstract.

G. Masera et al., "VLSI Architectures for Turbo Codes", IEEE Transactions on Very Large Scale Integration Systems, vol. 7, No. 3, (Sep. 1999), pp. 369-379 with Abstract.

D. Divsalar et al., "Turbo Codes for PCS Applications", Proceedings of the International Conference on Communications, (1995), pp. 54-59 with Abstract.

Veterbi, A. J.: An intuitive justification and a simplified implementation of the MAP decoder for convolutional codes. Selected Areas in Communications, IEEE Journal on, IEEE, 1998, pp. 260-264.

* cited by examiner

TURBO CODE ENCODER

TURBO CODE DECODER

FIG. 8   PRIOR ART

ERROR CORRECTION CODE DECODING DEVICE

FIELD OF THE INVENTION

This invention relates to a technique for decoding an error correction code. More particularly, it relates to a decoding technique in which soft-output decoding of constituent elements for concatenated codes is repeated, as typified by a decoding method for turbo codes.

BACKGROUND OF THE INVENTION

The error correction encoding technique is a technique for protecting data from errors, such as bit inversion, produced on a communication channel during data transmission through the operations of data encoding and decoding, and is now finding extensive use in such fields as digital wireless communication or recording medium. Encoding is the operation of transforming the information for transmission into a codeword having redundant bits appended. Decoding is the operation of estimating the transmitted codeword (information) from the codeword admixed with error (received word) by taking advantage of the redundancy.

As for the error correction code, plural decoding methods are plausible even if the code is the same. Usually, the decoded result is given as a codeword or an information bit string which generates it. There is also known a decoding method comprising estimating the received sequence with weighting. This method is called a soft-output decoding method. The optimal soft-output decoding method outputs conditional probability of respective bits of the information symbol or the codeword, with a received word as the condition, under the constraint condition that the optimum soft-output decoding is a symbol string forming the codeword, and is termed an a posteriori probability decoding method. If the information symbol is binary-valued, it is sufficient for the a posteriori probability decoding to generate $L(u(k))$ given by the following equation (1):

$$L(u(k))=\log(P(u(k)=0|Y)/P(u(k)=1|Y)) \quad (1)$$

where $u(k)$ is the kth information bit, Y is a received word, and $P(u(k)=1|Y)$ (b=0,1) is a conditional probability that $u(k)=b$ under a condition that a received word is Y.

Figures 7A, 7B:
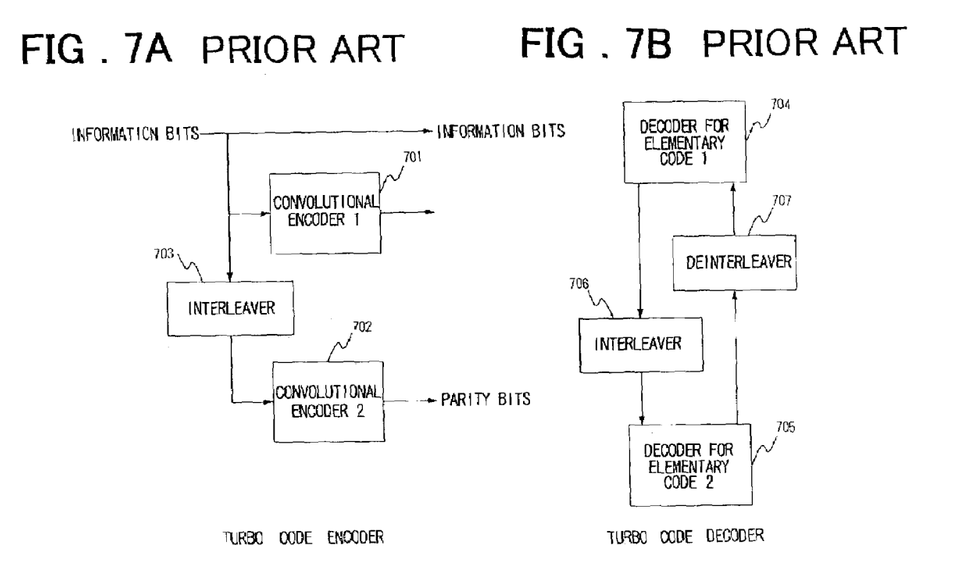
FIGS. 7A and 7B are block diagrams showing an illustrative structure of an encoder and a decoder for turbo codes.

In 1993, high performance codes, called turbo codes, were proposed. The turbo codes are discussed in great detail in a Publication 1: "Near Shannon limit error-correcting coding and decoding: Turbo codes(1)" (Proceedings of IEEE International Conference of Communications, pp. 1064–1070, 1993). FIG. 7 shows an illustrative structure of a turbo code encoder and a turbo code decoder. Referring to FIG. 7a, the turbo code encoder is basically built using a parallel concatenation of two systematic convolutional encoders 701 and 702, each having a feedback loop, with interposition of an interleaver 703, wherein a memory number not larger than 4 is routinely used. The interleaver 703 is means for reordering a bit sequence. It is noted that the code performance is significantly affected by the size and the designing of the interleaver 703. The parity bits, generated by the convolutional encoders 701 and 702, in conjunction with information bits, are termed elementary codes 1 and 2, respectively.

As shown in FIG. 7b, in the turbo code decoder, decoders 704 and 705 are provided in association with the arrangement of the encoders. The decoder 704 is means for decoding the elementary code 1, whilst the decoder 705 is means for decoding the elementary code 2. As characteristic of the decoding method for the turbo codes, the aforementioned soft-output decoding method is applied to the decoders 704 and 705. The decoder 704(or 705) handles soft-output values for the respective information bits, generated by the decoder 704(or 705), as the a priori information, and decodes the received value with weight applied to the received value. It is noted that the value used as the a priori information in the other decoder is not the value $L(u(k))$ of the equation (1) per se, but a value $Le(u(k))$, termed the extrinsic information, represented by the following equation (2):

$$Le(u(k))=L(u(k))-C \cdot y(k)-La(u(k)) \quad (2)$$

where $y(k)$ is a received value for the information bit $u(k)$, $La(u(k))$ is the a priori information which, in decoding turbo codes, coincides with the extrinsic information generated by the other decoding means, and C is a constant determined by the S/N ratio of the communication channel. In the iterative decoding of turbo codes, transition to the decoding of the elementary code 2 is made after completion of the elementary code 1. The elementary code 2 is read-in to the decoder 705, with bit reordering performed by the interleaver 706 similar in structure to the interleaver 703, so that the sequence of the information bits of the elementary code 2 in the interleaver 706 will be the same as that in the interleaver 703, for use as the a priori information. The decoder 705 reads-in the received value for the information bits as the sequence thereof is changed by the interleaver 706. In the iterative decoding, the decoding of the elementary code 1 is again performed after the decoding of the elementary code 2 has completely come to a close. In a deinterleaver 707, performing inverse conversion to that in the interleaver 706, the extrinsic information is reordered so that the sequence of the extrinsic information will be coincident with the sequence of the information bits of the elementary code 1. The turbo decoding is featured by the iterative decoding structure in which the extrinsic information is sequentially updated between the two decoders. The decoding error rate is sequentially improved with the progress of the iterative decoding. If the decoding of the elementary codes 1 and 2 is counted as one iteration, a number iterations from 2 to 10 usually suffices. In general, the smaller the SN ratio of the communication channel, the larger the number of iterations must be. The value of $L(u(k))$ ultimately obtained as the result of the iteration is adopted by hard decision as being the decoded information to terminate the decoding processing.

For developing the decoding device for turbo codes, the designing of the aforementioned soft-input and soft-output device for the convolutional codes is crucial. The soft-input and soft-output decoding of the convolutional codes may be efficiently executed by taking advantage of a trellis structure of the codes. As the soft-input and soft-output decoding algorithm for outputting the value $L((u(k))$ of the equation (1) by taking advantage of the code trellis, the BCJR algorithm, also termed as MAP algorithm, is known, and is described in greater length in a Publication 2: "Optimal decoding of linear codes for minimizing symbol error rate" (IEEE Transaction on Information Theory, pp. 284–287, 1974). There are also known Max-Log-Map Algorithm and Log-Map algorithms which may reduce the computational complexity by finding an approximate value of $L(u(k))$ of the equation (1). These algorithms are discussed in greater detail in for example a Publication 3: "A Comparison of optimal and sub-optimal MAP decoding algorithms operating in the Log Domain"(Proceedings of IEEE International Conference of Communications, pp. 1009–1013, 1995).

These algorithms include a processing for finding the probability of reaching each node from the trellis start state (forward value), that is the forward processing, a processing for finding the probability of reaching each node from the trellis end state (backward value), that is the backward processing, and a soft-output generating processing for actually finding the values of the equations (1) and (2), or a soft-output corresponding to its approximate value, by exploiting the forward and backward values, under the conditions of the received sequence and the a priori information. The forward processing is a processing similar to the Viterbi decoding known as the maximum likelihood method for the convolutional codes, and updates the forwards value at forwardly proceeding discrete time points. The backward processing updates the backward values retrogressively as from the trellis end point. The above algorithms differ from the Viterbi decoding as to the necessity of the backward processing.

Figure 8:
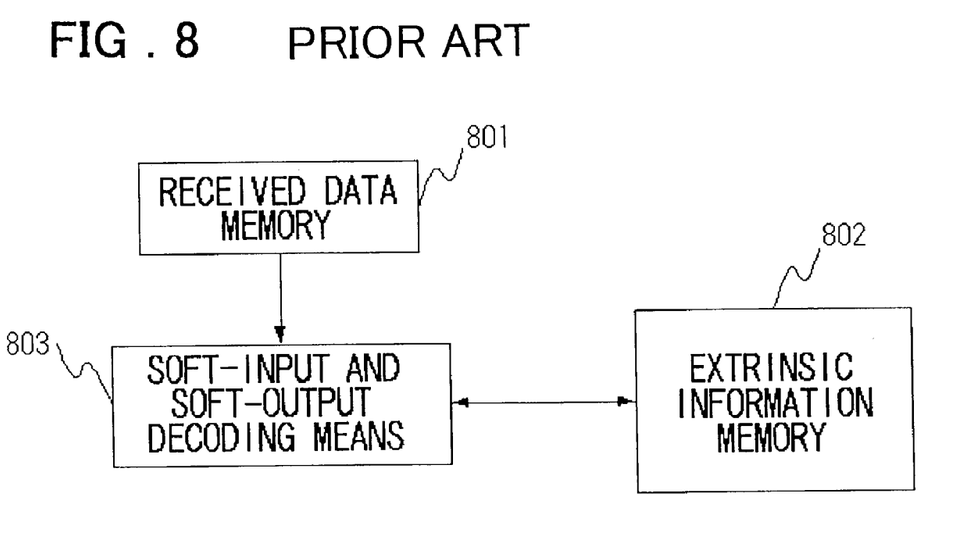
FIG. 8 is a block diagram showing an illustrative structure of a turbo codes decoder.

FIG. 8 illustrates a typical configuration of a turbo code decoder. In FIG. 8, a received data memory 801 stores received values from a demodulator, not shown. An extrinsic information memory 802 stores the extrinsic information of respective information bits previously output in the process of the iterative decoding. A soft-input and soft-output decoding means 803 for elementary codes reads in data from the received data memory 801 and the extrinsic information memory 802 to write the calculated extrinsic information in the extrinsic information memory 802, while executing address conversion for matching to the interleaver as necessary. Since the turbo codes use convolutional codes with a large number of time points, localized decoding which is adapted to exploit a portion of the trellis to produce a successive output, without exploiting the entire trellis, can be realized to enable reduced size of the soft-input and soft-output decoding means 803. In a routine system in which decoding processing is started from the initial point of the trellis, how backward processing is to be carried out poses a problem. In this connection, it has been shown to be sufficient to carry out the backward processing assuming that all states comprise a preset number of time points of the trellis, termed a window. Such processing is discussed in great detail in, for example, a Publication 4: "Soft-output decoding algorithms for continuous decoding of parallel concatenated convolutional codes" (Proceeding of IEEE International Conference on Communications, pp. 112–117, 1996).

In a decoder, it is critical to improve both data throughput, and device size. In a method employing the window as described above, it is desired of the soft-output decoding to output a soft-output each cycle. In a Publication 5: "An intuitive justification on and a simplified implementation of the MAP decoder for convolutional codes" (IEEE Journal on Selected Areas on Communications, pp.260–264, 1998), there is disclosed a method of constructing a decoding schedule by providing backward processing units corresponding to two time points, which are operated with a shift of the time points corresponding to the window size. There has also been proposed in a Publication 6: "VLSI architectures for turbo codes"(IEEE Transactions on VLSI systems, pp.369–379, 1999) a hardware structure consisting in providing a number of backward processing operations corresponding to the number of the window size time points and to pipeline the processing operations. In this device configuration, it is possible to read-in received values in succession to continuously generate soft-output with a delay equal to twice the window size.

SUMMARY OF THE DISCLOSURE

Accordingly, it is an object of the present invention to provide an error correction code decoding device for soft-input and soft-output decoding of convolutional codes in which the number of registers holding backward values is reduced, thereby reducing the size of the device while still keeping high throughput in the device. Another object of the present invention is to provide an error correction code decoding device for soft-input and soft-output decoding of convolutional codes in which the number of times of repetition in case the decoding processing is carried out simultaneously between different codes is diminished to speed up the turbo decoding processing.

As characteristic of the turbo codes decoding, the decoding is repeated as the extrinsic information obtained by soft-output decoding of the elementary codes is exchanged to improve the decoding performance. This feature of iterative decoding gives rise to delay. In general, if the SN ratio of the communication channel is small, the processing of the decoders 704 and 705 shown in FIG. 7 needs to be repeatedly carried out about ten times. The presence of the interleaver and the deinterleaver also leads to difficulties in simple pipelining between decoding of elementary codes. As means for solving this iteration delay, such a method may be proposed which consists in simultaneously decoding the elementary codes 1 and 2. The method is discussed in for example a Publication 7: "Turbo codes for PCS Applications (Proceedings of the International Conference on Communications, pp.54–59, 1995). This method is of such a system in which a conventional system of decoding the two elementary codes in the order of 1, 2, 1, 2, . . . and a system of decoding the two elementary codes in the order of 2, 1, 2, 1, . . . are carried out simultaneously and independently of each other for ultimately performing a hard decision output. Only with this respect, the disclosed method differs from the conventional system of decoding the two elementary codes serially in the order of 1, 2, 1, 2, . . . . That is, the method disclosed in the Publication 7 is essentially equivalent to a duplex version of the conventional system. In the light of the computational complexity or processing volume, the number of time of simultaneous decoding processing of the elementary codes 1 and 2 once is one, however, the disclosed method is intrinsically a duplex version of the conventional system, thus increasing the number of times of the repetitive operations.

Accordingly, it is an object of the present invention to provide an error correction code decoding device for soft-input and soft-output decoding of convolutional codes in which the number of registers holding backward values, as the high throughput of the device is kept, is reduced, thereby reducing the size of the device. Another object of the present invention is to provide an error correction code decoding device for soft-input and soft-output decoding of convolutional codes in which the number of times of repetition in case the decoding processing is carried out simultaneously between different codes is diminished to speed up the turbo decoding processing.

Of the above objects reducing the number of the registers for holding backward values high throughput is kept, is attained by an error correction code decoding apparatus, in accordance with one aspect of the present invention, for generating a soft-output by executing forward processing and backward processing on a code trellis based on received data and the a priori information, and by exploiting the values as calculated by the forward processing and backward processing, wherein the decoding apparatus includes a plural number of backward processing modules for simultaneously executing backward processing at different time points on the code trellis, the received data and the a priori information are periodically read in from a memory in a reverse sequence, the received data and the a priori information read in from the memory or the received data and the a priori information output from preset other backward processing modules are input to the backward processing modules and wherein the backward processing module, supplied with the received data and with the a priori information, is changed over to another at an interval corresponding to the aforementioned period.

With the configuration of the present invention, it becomes possible to issue the soft-output at a normal sequence each cycle and to realize a large window even if the number of time points of the input data stored in each the backward processing module T is reduced. With the number of the backward processing modules being n and with T=2B, the minimum value of the size of the window determining the decoding characteristics is given by (n−1)B. Since the number of registers needed by means for carrying out forward processing and soft-output generation is proportionate to B, an error correction code decoding device with a smaller number of resisters can be produced by realizing a device configuration with large n without deteriorating the decoding characteristics.

In accordance with another aspect of the present invention, for reducing the number of times of reiteration in case the decoding is carried out simultaneously between different elementary codes to speed up the decoding, there is also provided an error correction code decoding apparatus for iterative decoding of error correction codes on which a plural number of convolutional codes are concatenated in parallel via an interleaver, said apparatus comprising: received data storage means for storing received data; extrinsic information storage means for storing extrinsic information associated with a plurality of elementary codes respectively; and a plurality of local soft-input and soft-output decoding means, each capable of performing local input and output of said elementary codes; wherein said plural local soft-input and soft-output decoding means operate in parallel to one another; and said local soft-input and soft-output decoding means reading in and decoding extrinsic information incidentally updated by the local soft-input and soft-output decoding means associated with other elementary code.

With this configuration, in which the elementary codes 1 and 2 are executed simultaneously, the processing time for one iteration is one-half that in case of a conventional turbo decoding which sequentially repeats the decoding of the elementary codes 1 and 2. Moreover, in this configuration, including the local soft-input and soft-output decoding means, the soft-output may be generated using the already updated extrinsic information, even with only one reiteration, so that the number of times of repetition may be prohibited from increasing even though the elementary codes 1 and 2 are decoded simultaneously.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRWINGS

PREFERRED EMBODIMENTS OF THE INVENTION

Preferred embodiments of the present invention will be explained in detail with reference to the drawings.

Figure 1:
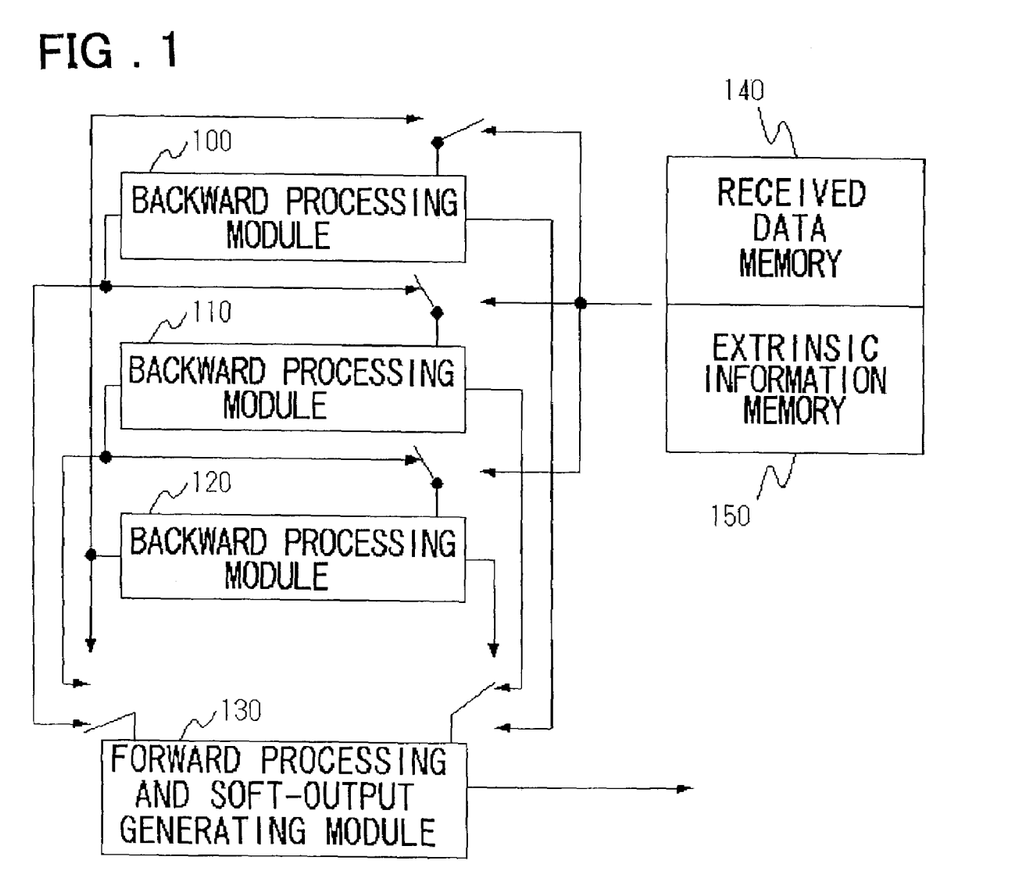
FIG. 1 is a block diagram showing an illustrative structure of a first embodiment of the present invention.

A first embodiment of the present invention is shown in FIG. 1 which illustrates the structure of a turbo decoder 704 or 705 shown in FIG. 7b. The decoder comprises plural backward processing modules 100, 110 and 120, a forward processing and soft-output generating module 130, a received data memory 140 and an extrinsic information memory 150. The received data memory 140 and the extrinsic information memory 150 are usually implemented as external memories. Although the following explanation is made for a case in which the number of backward processing modules is "3", it may also be any plural number.

An input to the backward processing modules 100, 110 and 120 is the received data and the a priori information, more specifically, the received data or the a priori information read in from the received data memory 140 and the extrinsic information memory 150, or these data or information output from the other backward processing modules. The backward processing modules, supplied with the received data and with the a priori information, are cyclically changed over at a preset period, while the processing module, not currently reading in the data or the information from the memories 140 and 150, reads in the received data or the a priori information being output from the backward processing module which is located immediately in front of the processing module not currently reading from the memories, in the read-in sequence from the memories 140 and 150. FIG. 1 shows a state in which the backward processing module 100 is reading in the received data and the a priori information from the memories 140 and 150, while the backward processing modules 110 and 120 are being supplied with the received data and the a priori information being output from the backward processing modules 100 and 110 respectively.

The input to the forward processing and soft-output generating module 130 is the received data and the a priori information, output from one of the backward processing modules, and the backward values, output from the backward processing modules different from the one backward processing module. The one backward processing module is the module currently reading in the received data and the a priori information from the memories 140 and 150, while the aforementioned other backward processing modules are those having the read-in sequence from the memories 140 and 150 which is next to that of the one backward processing module. FIG. 1 shows a state in which the forward processing and soft-output generating module 130 is being supplied with the received data and the a priori information, output from the backward processing module 100, and with the backward value output from the backward processing module 100. That is, in the present embodiment, soft-input and soft-output decoding processing is implemented by a structure in which plural modules as plural processing units are simply concatenated together. The respective processing modules will now be explained in detail.

Figure 2:
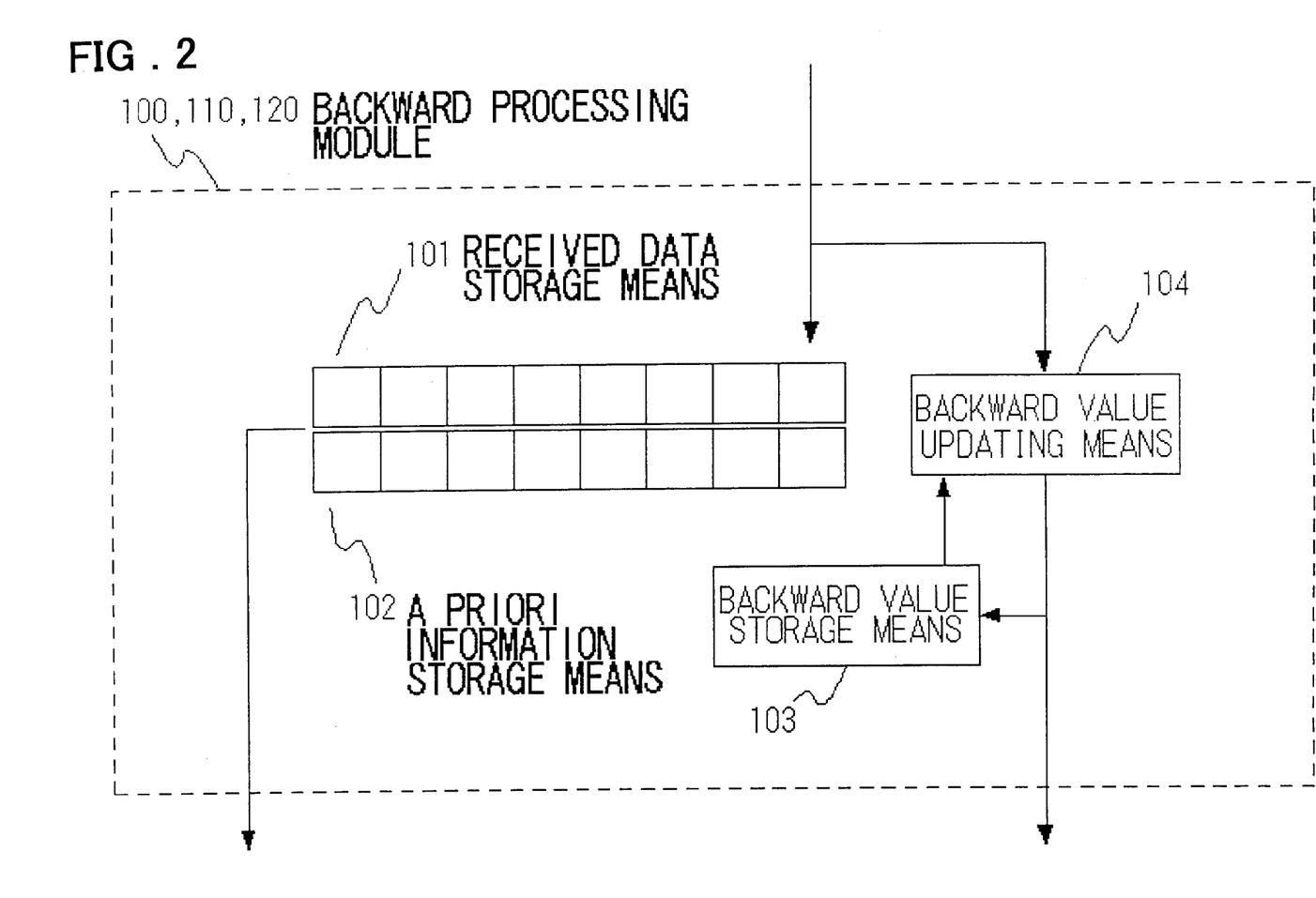
FIG. 2 is a block diagram showing an illustrative structure of backward processing modules 100, 110 and 120.

The backward processing modules 100, 110 and 120 are all of the identical configuration. Referring to FIG. 2, each of the backward processing modules of 100, 110 and 120 comprises a received data storage means 101, a priori information storage means 102, a backward value storage means 103 and a backward value updating means 104. The received data storage means 101 and the a priori information storage means 102 are each comprised of a shift register. In the following description, the received data storage means 101 and the a priori information storage means 102 are sometimes referred to as shift registers 101 and 102, respectively. It may be seen from simultaneous reference to FIG. 1 that the decoder in its entirety forms a circular unit by the series connection of the shift registers. That is, the present embodiment may be construed to be a configuration comprised of plural modules, that is the backward value storage means 103 and the backward value updating means 104, received data storage means and the a priori information storage means comprised in turn of a sole large-sized shift register. The shift registers 101 and 102 are of the same length (equal even number of shift register elements). The received data, read in from a received data memory 140, is stored in the received data storage means 101, while the a priori information, read in from the extrinsic information memory 150, is stored in the a priori information storage means 102. At this time, data of a location, address-converted in the interleaver or in the deinterleaver, is read in as necessary. The backward value storage means 103 is made up by a register for storing the backward value in each state corresponding to one time point of the convolutional codes. The backward value updating means 104 updates the value of the backward value storage means 103 based on the input data. Outputs from the backward processing modules 100, 110 and 120 are updated backward values and the received data and the a priori information, output from the terminal ends of the shift registers 101 and 102.

Figure 3:
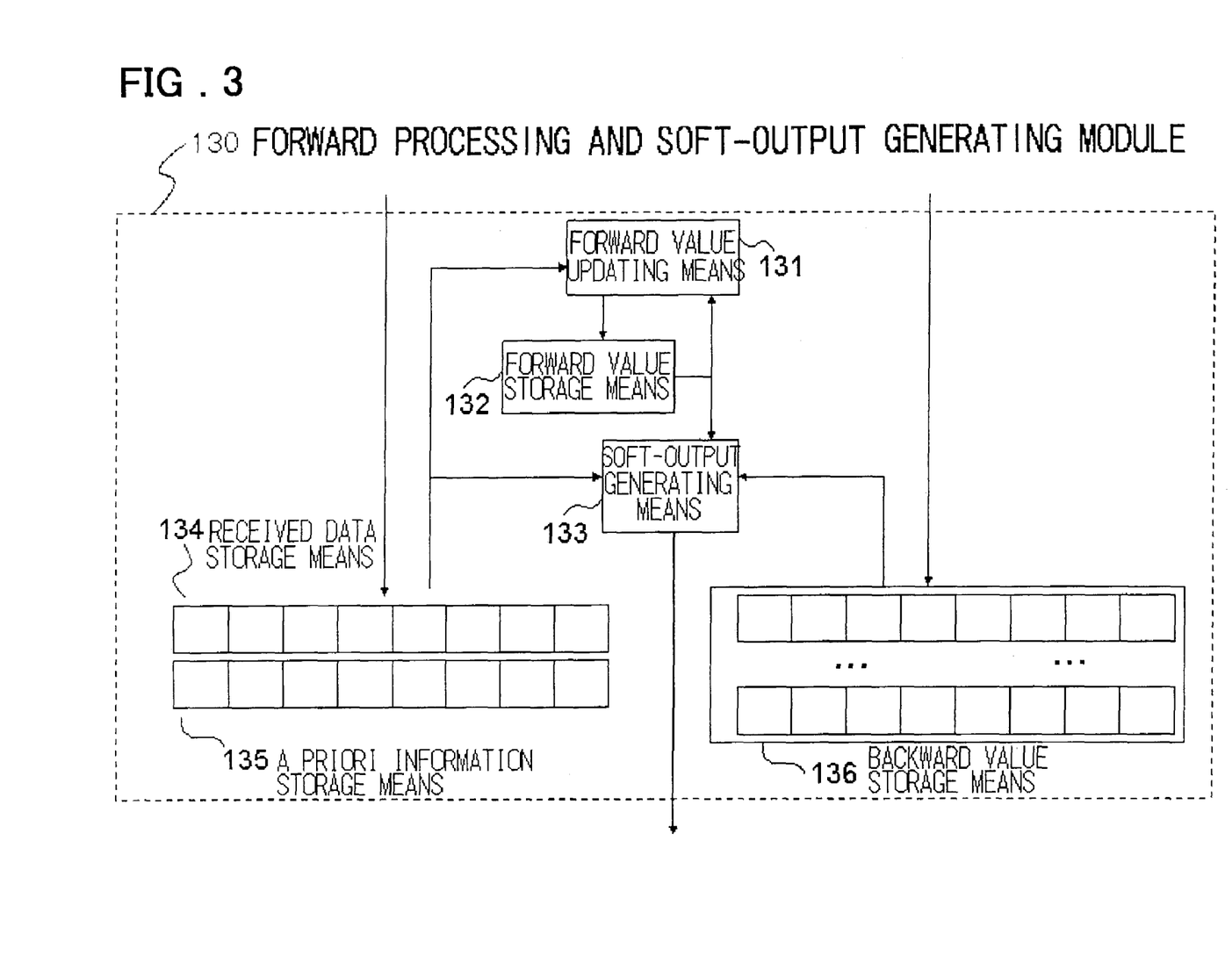
FIG. 3 is a block diagram showing an illustrative structure of a forward processing and soft-output generating module 130.

Referring to FIG. 3, the forward processing and soft-output generating module 130 comprises a forward value updating means 131, a forward value storage means 132, a soft-output generating means 133, a received data storage means 134, an a priori information storage means 135 and a backward value storage means 136. The forward value updating means 131 executes the forward processing as from the leading end of the code trellis. The forward value storage means 132 is made up by at least the same number of registers as the number of states of the convolutional codes. The received data storage means 134, and the a priori information storage means 135 each are made up by a shift register the necessary and sufficient number of the shift register stages of which corresponds to the length of the backward processing module. The backward value storage means 136 is made up by a number of registers equal to the length of the shift registers multiplied by the number of states of the convolutional codes.

The operation of the respective sites of the present embodiment is now explained.

The basic point of the present invention is that the received data storage means 101, a priori information storage means 102, backward value updating means 104, as an operating part, in the backward processing modules 100, 110 and 120, and the forward value updating means 131 and the soft-output generating means 133 in the forward processing module 130 are operated at the same step. The step for one time point processing of the convolutional codes by these elements is referred to as one cycle in the below.

The backward processing modules 100, 110 and 120 read-in received data and the a priori information for one time point from the memories 140, 150 or from the neighboring backward processing modules 120, 110 and 100 each cycle. With the input from the memories 140 and 150, the backward processing modules periodically change over in the sequence of the backward processing module 100→backward processing module 110→backward processing module 120→backward processing module 100 . . . With the length 2B of the shift register forming the received data storage means 101, the period is equal to B. The backward processing module, which reads in the received data and the a priori information from the memories 140 and 150, reads in the received data and the a priori information for the B cycles next to the received data and the a priori information on the memories 140 and 150, already read in, in the reverse order (in the sequence reversed from the sequence of occurrence). On the other hand, the backward processing module which receives the input form other than the memories 140 and 150 is supplied with the received data and the a priori information output from the neighboring backward processing module.

Consequently, the received data and the a priori information at a time point B, . . . , 1, of the received data and the a priori information on the memories 140 and 150 are first read in the backward processing module 100. The received data and the a priori information at time points 2B, . . . , B+1 are read in by the backward processing module 110, the received data and the a priori information at time points 3B, . . . , 2B+1 are read in by the backward processing module 120 and the received data and the a priori information at time points 4B, . . . , 3B+1 are read in by the backward processing module 100. The received data and the a priori information, read in by the backward processing modules, are supplied to the received data storage means 101, a priori information storage means 102 and to the backward value updating means 104.

The received data storage means 101 and the a priori information storage means 102, each composed by a shift register, shift the input received data and the a priori information one step each cycle respectively. Since the number of stages in the shift registers composing the received data storage means 101 and the a priori information storage means 102 respectively is 2B, the backward processing modules 100, 110 and 120 output the input received data and the a priori information with a delay of 2B.

The backward processing modules 100, 110 and 120 are all of the identical configuration. Referring to FIG. 2, each of the backward processing modules of 100, 110 and 120 comprises a received data storage means 101, a priori information storage means 102, a backward value storage means 103 and a backward value updating means 104. The received data storage means 101 and the a priori information storage means 102 are each comprised of a shift register. In the following description, the received data storage means 101 and the a priori information storage means 102 are sometimes referred to as shift registers 101 and 102, respectively. It may be seen from simultaneous reference to FIG. 1 that the backward processing modules 100, 110 and 120 can be connected in series. The present embodiment may be construed to be a configuration comprised of plural modules, that is the backward value storage means 103 and the backward value updating means 104, received data storage means and the a priori information storage means comprised in turn of a sole large-sized shift register. The shift registers 101 and 102 are of the same length (equal even number of shift register elements). The received data, read in from a received data memory 140, is stored in the received data storage means 101, while the a priori information, read in from the extrinsic information memory 150, is stored in the a priori information storage means 102. At this time, data of a location, address-converted in the interleaver or in the deinterleaver, is read in as necessary. The backward value storage means 103 is made up by a register for storing the backward value in each state corresponding to one time point of the convolutional codes. The backward value updating means 104 updates the value of the backward value storage means 103 based on the input data. Outputs from the backward processing modules 100, 110 and 120 are updated backward values and the received data and the a priori information, output from the terminal ends of the shift registers 101 and 102.

In each cycle, the input data to a given backward processing module and the backward value generated therein becomes an input to the forward processing and soft-output generating module 130. This given backward processing module is the module immediately ahead of the backward processing module reading in the received data and the a priori information from the memories 140 and 150. For example, if the backward processing module 100 is reading in the received data and the a priori information from the memories 140 and 150, as shown in FIG. 1, the backward processing module 110 is to be the given backward processing module.

The forward value updating means 131 updates the forward value stored in the forward value storage means 132 in accordance with the contents of the received data storage means 134 and the a priori information storage means 135. The soft-output generating means 133 generates the extrinsic information Le(u(k)), given by the equation (2), from the received data stored in the received data storage means 134, a priori information stored in the a priori information storage means 135 and the backward values stored in the backward value storage means 136. The soft-output generating means 133 also generates the information indicating the result of hard decision stored in the a priori information storage means 135. The generated information is again written in the extrinsic information memory 150 or in a separate memory so as to be used for the next iteration in the iterative decoding.

Figure 4:
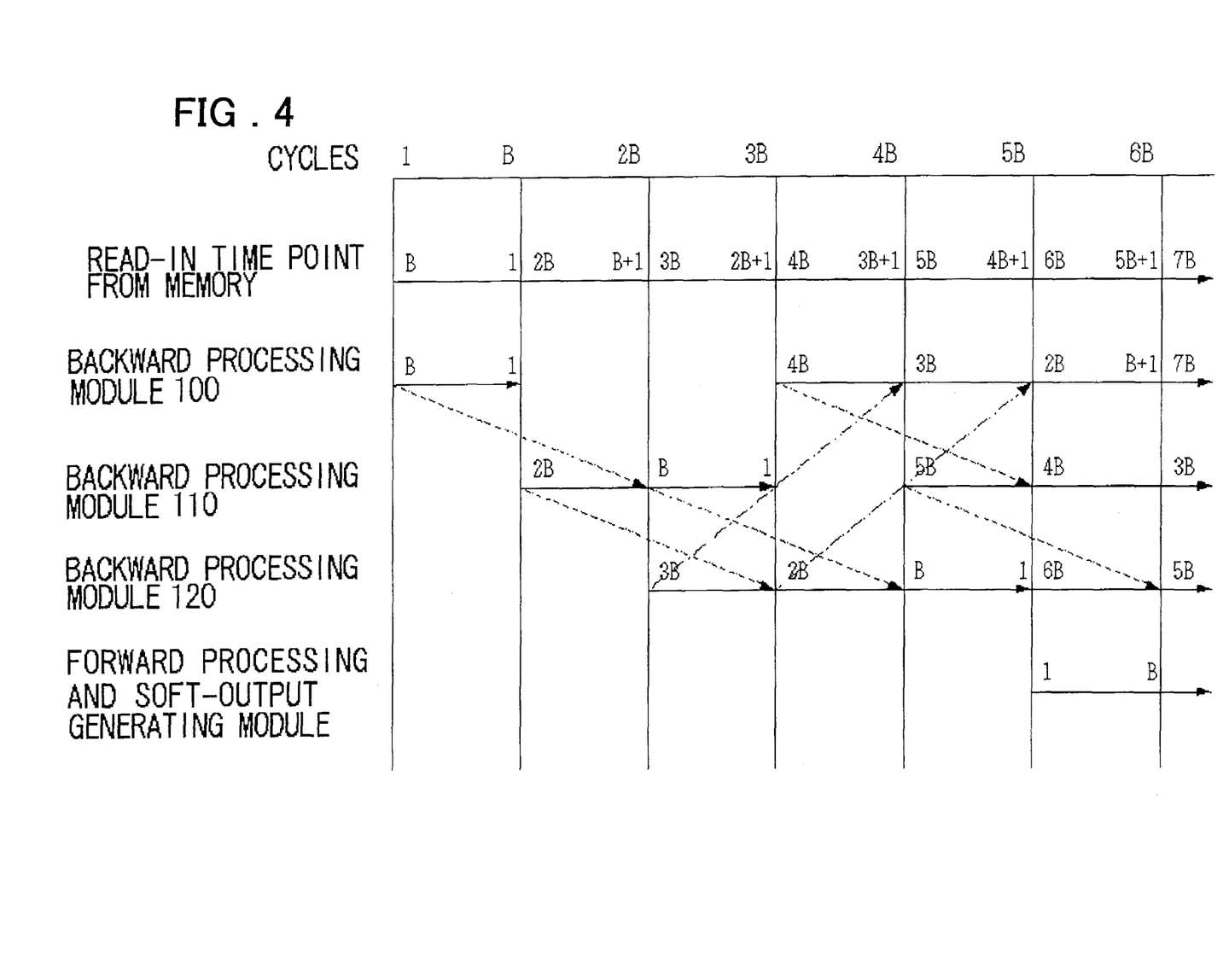
FIG. 4 illustrates which time point processing on the code trellis the backward processing modules 100, 110 and 120 and the forward processing and soft-output generating module 130 are performing at each decoder cycle.

Referring to FIGS. 1 to 4, the operation of the present embodiment is explained in greater detail. FIG. 4 is a trellis diagram indicating which portion of the decoder shown in FIGS. 1 to 3 is performing the processing in each cycle as from the start of the decoding and to which time point corresponds the processing on a code trellis.

In the cycles 1 to B, the backward processing module 100 initializes the backward value storage means 103 and sequentially reads in the received data and the a priori information at the time points B−1, . . . , 1 from the memories 140 and 150 to carry out the backward processing.

At the cycles B+1 to 2B, the backward processing modules 110 initializes the backward value storage means 103 and sequentially reads in the received data and the a priori information of the time point 2B, 2B−1, . . . , B+1 from the memories 140 and 150 to execute the backward processing.

At the cycles 2B+1 to 3B, the backward processing modules 120 initializes the backward value storage means 103 and sequentially reads in the received data and the a priori information of the time point 3B, 3B−1, . . . , 2B+1 from the memories 140 and 150 to execute the backward processing. Moreover, in these cycles 2B+1 to 3B, the backward processing modules 100 outputs the received data and the a priori information of the time points B, B−1, . . . , 1 to the backward processing modules 110 and accordingly the backward processing modules 110 executes the backward processing. That is, the backward processing modules 110 sequentially finds the backward values from the time point 2B to the time points B, B−1, . . . , 1.

At the cycles 3B+1 to 4B, the backward processing modules 100 initializes the backward value storage means 103 and sequentially reads in the received data and the a priori information of the time point 4B, 4B−1, . . . , 3B+1 from the memories 140 and 150 to execute the backward processing. Moreover, in these cycles 3B+1 to 4B, the backward processing modules 120 outputs the received data and the a priori information of the time points 2B, 2B−1, . . . , B+1 to the backward processing modules 120 and accordingly the backward processing modules 120 sequentially finds the backward values from the time point 3B to the time points 2B, 2B−1, . . . , B+1.

At the cycles 4B+1 to 5B, the backward processing modules 110 initializes the backward value storage means 103 and sequentially reads in the received data and the a priori information of the time point 5B, 5B−1, . . . , 4B+1 from the memories 140 and 150 to execute the backward processing. In these cycles 4B+1 to 5B, the backward processing modules 120 outputs the received data and the a priori information of the time points 3B, 3B−1, . . . , 2B+1 to the backward processing modules 100 and accordingly the backward processing modules 100 sequentially finds the backward values from the time point 3B to the time points 3B, 3B−1, . . . , 2B+1. Moreover, in these cycles 4B+1 to 5B, the backward processing module 110 outputs the received data and the a priori information of the time points B, B−1, . . . , 1 to the backward processing modules 120 and accordingly the backward processing modules 120 sequentially finds the backward values from the time point 3B to the time points B, B−1, . . . , 1 (backward values of the window sizes 2B to 3B). That is, the backward values with the window size not less than 2B can be calculated. In similar manner, each backward processing module is able to calculate the backward values with the window size not less than 2B.

On the other hand, the forward processing and soft-output generating module 130 stores the backward values, calculated in the backward processing module 120 at cycles 4B+1 to 5B, in the backward value storage means 136. The received data and the a priori information at the time points B to 1 as used in the backward processing module 120 in calculating the backward value (received data and the a priori information at the time points B to 1 output from the backward processing module 110) are also saved in the received data storage means 134 and in the a priori information storage means 135. Thus, using these data and the information, the forward processing and the soft-output generating processing from the time point 1 can be started as from the next cycle 5B+1.

At the next cycle 5B+1 to 6B, the forward processing and soft-output generating module 130 causes the backward values (corresponding to the time points 2B, 2B−1, . . . , B+1), output from the module 100, to be stored in the backward value storage means 136, while causing the received data and the a priori information (corresponding to the time points 2B, 2B−1, . . . , B+1), output from the backward processing module 120, to be stored in the received data storage means 134 and in the a priori information storage means 135. In the present embodiment, the number of the registers that make up the received data storage means 134 and the a priori information storage means 135 respectively is 2B, while the number of the registers that make up the backward value storage means 136 is 2B multiplied by the number of states, so that the above data can be stored without overwriting the locations currently used for forward processing and for soft-output generating processing. For example, each of the storage means 134–136 may be divided into two equal portions, that is a former half portion and a latter half portion, and the former half portion may be used for (forward processing and soft-output generating processing)→(storage processing)→ (forward processing and soft-output generating processing) . . . , while the latter half portion may be used for (storage processing)→(forward processing and soft-output generating processing)→(storage processing).

The meritorious effect of the present embodiment is as follows:

In the present embodiment, plural backward processing modules 100, 110 and 120, adapted for reading in data for a preset number of time points (B) from the memories 140 and 150 in the reverse sequence, are concatenated together, and the backward processing module which reads in from the memories 140 and 150 are cyclically changed over in the sequence of 100→110→120→100 . . . . There are provided means (received data storage means 101 and a priori information storage means 102) for delaying the received data and the a priori information read-in from the memories 140 and 150 and the received data and the a priori information sent from the directly previous backward processing module by 2B and for sending the so delayed data and information to the backward processing module directly ahead, and means (backward value storage means 103 and the backward value updating means 104) for calculating the backward values based on the received data and the a priori information input to the backward processing module currently reading in the received data and the a priori information, so that the backward processing modules 100, 110 and 120 are able to cyclically calculate the backward values with the window size of 2B to 3B. On the other hand, the forward processing and soft-output generating module 130 includes means (forward value updating means 131, forward value storage means 132, received data storage means 134 and the a priori information storage means 135) for calculating the forward values based on the received data and the a priori information being output by the backward processing module reading in from the memories 140 and 150, and means (soft-output generating means 133 and the backward value storage means 136) for generating soft-output based on the backward value of the window sizes 2B to 3B, cyclically calculated by the backward processing modules 100, 110 and 120, forward values, received data and the a priori information, so that the soft-output can be continuously generated on the cycle basis after a preset delay. The window size can be increased to realize satisfactory decoding characteristics even if the number of time points of input data stored by each backward processing module is reduced.

Figure 5:
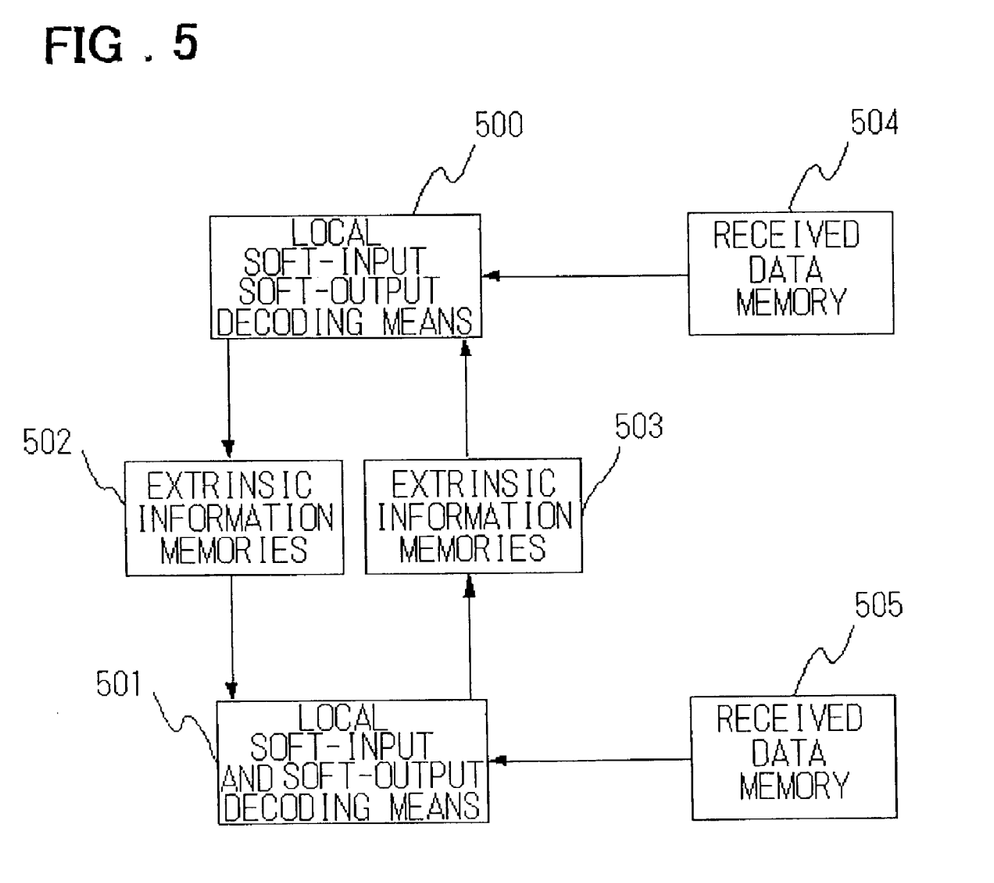
FIG. 5 is a block diagram showing an illustrative structure of a second embodiment of the present invention.

A second embodiment of the present invention is now explained. The present embodiment includes local soft-input and soft-output decoding means for respective elementary codes of the turbo codes. Referring to FIG. 5, the present embodiment comprises local soft-input and soft-output decoding means 500 and 501, extrinsic information memories 502 and 503, and received data memories 504 and 505. The soft-input and soft-output decoding means 500 and 501 correspond to the code elements 1 and 2, respectively, and are configured as shown for example in FIG. 1. The soft-input and soft-output decoding means 501 corresponds to the elementary code 2. The soft-input and soft-output decoding means 500 reads in the extrinsic information from the extrinsic information memory 503 to write the generated extrinsic information in the extrinsic information memory 502. On the other hand, the soft-input and soft-output decoding means 501 reads in the extrinsic information from the extrinsic information memory 502 to write the generated extrinsic information in the extrinsic information memory 503. The read/write to or from the memories is carried out as the addresses are transformed in an interleaver or in a deinterleaver depending on the turbo codes configuration.

The meritorious effect of the present embodiment is now explained. In the present embodiment, the soft-input and soft-output decoding means 500 and 501 are provided for respective elementary codes, whereby the elementary codes 1 and 2 can be decoded simultaneously in parallel instead of decoding the elementary codes sequentially as in the conventional turbo codes decoding system. Moreover, the local soft-input and soft-output decoding means are used and the two extrinsic information memories 502 and 503 are provided as shown in FIG. 5 to render it possible to incidentally use the updated extrinsic information instead of having the two decoders operate independently during the processing of one repetition processing as in the conventional parallel decoding system for the elementary codes 1 and 2. Thus, it may be expected to increase the extrinsic information updating speed under the situation of simultaneously decoding the elementary codes 1 and 2.

An example of parameter setting in the aforementioned first embodiment is now explained. For achieving sufficient decoding performance, it is necessary to perform backward processing having a sufficient window length in the first embodiment. Assuming that the minimum value of the window size is W, the length of the shift registers 101 and 102 is 2B and the number of the backward processing modules is n, we have the relationship of the following equation (3):

$$W = B(n-1) \tag{3}$$

It is known in general that, with use of convolutional codes with m memories, it is sufficient to execute backward processing using windows with the number of time points equal to approximately 8 m. In the case where m=3, as widely used for turbo codes, it is favorable in the light of the device scale to set B and n to as small values as possible, on the condition that W in the equation (3) is not less than 24. It is desirable that B, which is a parameter determining the sizes of the received data storage means 101, 134, a priori information storage means 102, 135 and the backward value storage means 136, and n, which is a parameter determining the number of the backward processing modules, be set to optimum values, in relation to each other, under the condition that the equation (3) is met.

In reading in from the reception memory 140, such implementation may be thought of in which the branch metric is calculated first before proceeding to subsequent processing. In this case, it is not the received data itself but the branch metric that is stored in the received data storage means 101. Since one branch metric is produced for two received values for the rate of ½, the amount of bit increase is at most one for one entry. On the other hand, there is no need to calculate the branch metric in the backward processing module and in the forward processing module. In the present embodiment, since the same branch metric is used in plural backward processing modules, it is particularly effective to calculate and subsequently read-in the branch metric in the light of both the processing volume and the device scale.

In the following, preferred embodiment of the forward value updating means 131 and the received data storage means 134 are described. Here, the case which is based on the maximum a posteriori probability (MAP) decoding algorithm, also termed a BCJR algorithm, is described in great detail.

Let the set S of states of the convolutional codes be S={0, 1, ..., |S|−1}, and the forward and backward values at the time point t and in the state s be $\alpha(t,s)$ and $\beta(t,s)$, respectively. Moreover, let $\gamma$ (t,s,s') represent the probability of transition at time point t from the state S to the state S'. This probability can be calculated from the a priori information representing the likelihood between the codeword and the received value corresponding to the transition from the state s to the state s' and the a priori information representing the reliability of the information bits at the time point t. In a white Gauss communication channel, the likelihood may readily be calculated using the S/N ratio of the communication channel. It is characteristic of the turbo codes decoding to use the extrinsic information generated in decoding the other elementary code as the a priori information. The backward processing in the maximum a posteriori algorithm may be carried out, using the value after one time point, based on the following equation (4):

$$\beta(t, s) = \Sigma \beta(t+1, s') \gamma(t+1, s, s') \quad (4).$$

where, the sum $\Sigma$ is for s' in its entirety. The soft-output (a posteriori probability) at the time point t can be generated using $\alpha(t-1,s)$, $\beta(t+1,s')$ and $\gamma(t,s,s')$ for all states s and s'. The preferred implementation for each backward processing module is that in which circuits for finding the equation (4) for each of the states operate in parallel. On the other hand, the forward processing is carried out, using the value before one time point, based on the following equation (5):

$$\alpha(t, s) = \Sigma \alpha(t-1, s') \gamma(t, s', s) \quad (5).$$

In similar manner, the preferred implementation for forward processing module is that in which circuits for finding the equation (5) for each of the states operate in parallel.

In carrying out the soft-output generating processing at time point t, the following equation (6) and (7):

$$M0 = \Sigma\_(0) \alpha(t-1, s') \gamma(t, s', s) \beta(t, s') \quad (6)$$

$$M1 = \Sigma\_(1) \alpha(t-1, s') \gamma(t, s', s) \beta(t, s') \quad (7)$$

It is noted that $\Sigma\_(0)$ assumes all cases in which transition from s to s' corresponds to an information bit 0 and that $\Sigma\_(1)$ assumes all cases in which transition from s to s' corresponds to an information bit 1. From log(M1/M0), L(u(k)) in the equation (1) may be calculated, while the extrinsic information Le(u(k)) in the equation (2) can be easily calculated from this Le(u(k)). The Max-log-Map algorithm can be performed by taking the logarithms of $\alpha$, $\beta$ and $\gamma$ in the above processing to convert the product operation to the summation operation and taking the maximum value of the sum. As characteristic of the Max-log-Map algorithm, the product, which has been necessary in the maximum a posteriori probability algorithm, may be eliminated.

An example of the aforementioned second embodiment of the present invention is now explained. It is characteristic of the present second embodiment that the extrinsic information is successively updated in one iteration of iterative decoding. FIG. 6 shows the state of updating the extrinsic information. It is assumed that the elementary codes 1 and 2 are both of the information length=16 and that the interleaver transforms the information bits at the time point p to the time points given by the following equation (8) (p=0, 1, ..., 15):

$$p \to (5 \times p) \bmod 16 \quad (8).$$

As local decoding means, such a system in which received data and the extrinsic information of other elementary codes are read every four time points to output a soft-output is now considered. These four time points are here termed a block. In FIG. 6, 601 and 602 correspond to the external memories 503 and 502, shown in FIG. 5, respectively. More specifically, the extrinsic information as obtained on decoding the elementary code 2 is written in 601 in the deinterleaved sequence, while the extrinsic information as obtained on decoding the elementary code 1 is written in 602 in the interleaved sequence. In 601 and 602, colored(dotted) frames indicate the locations of the a priori information corresponding to the already updated extrinsic information in the current iteration of the iterative decoding.

Figure 6A:
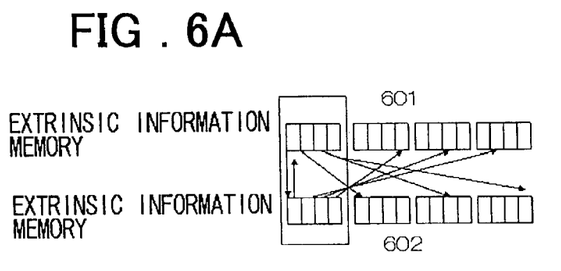
FIGS. 6A to 6D schematically shows the manner of updating of the extrinsic information in the second embodiment of the present invention.
Figure 6B:
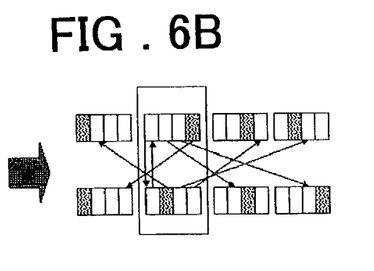
Figure 6C:
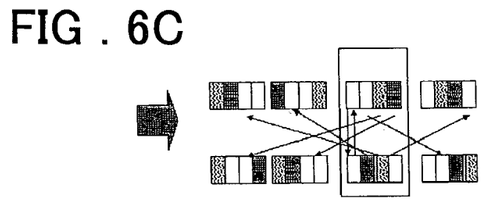
Figure 6D:
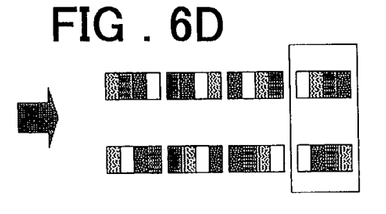

There is no a priori information read in on decoding the first block and which has been updated in the current iteration(FIG. 6A). After the end of the first block, the extrinsic information of the block 1 (time points 0, 1, 2 and 3) has been generated, so that, from the equation (8), the updated a priori information can be exploited for the time points corresponding to the time points 0, 5, 10 and 15 of the elementary codes. Thus, for decoding the second block by the decoding means of the elementary code 2, the already updated a priori information for the time point 5 can be exploited (FIG. 6B). Similarly, the updated extrinsic information can be exploited as the a priori information of the time point 7 in decoding the second block of the elementary code 1 (FIG. 6B). At the end of the second block, the a priori information of the time points 4, 9, 14 and 3 of the elementary code 2, corresponding to the time points 4, 5, 6 and 7 of the elementary code 1, from the equation (8), newly correspond to the extrinsic information generated by the current iteration in the iterative decoding. Thus, in decoding the third block of the elementary code 2, the time points 9 and 10 become the a priori information updated with the current iteration. In similar manner, in decoding the third block of the elementary code 1, the time points 10 and 11 become the a priori information updated with the current reiteration (FIG. 6C). In a similar manner, for the fourth block, the a priori information for three of the four time points for both the elementary blocks 1 and 2 may be decoded by exploiting the a priori information already updated with the current reiteration. Thus, in the present invention, the extrinsic information updated with the current reiteration can be exploited for almost all time points of the block towards the end of the elementary block, so that, even if the two elementary codes are decoded simultaneously, the decoding error rate characteristics with respect to the number of times of repetition may be maintained at a value of the order of that in the case of the conventional turbo decoding.

The meritorious effects of the present invention are summarized as follows.

According to the error correction code decoding device of the present invention, in which plural backward processing modules are concatenated and input data is periodically read in a reverse sequence, a large size window can be realized even if the soft-output is cyclically issued in the forward sequence and the number of time points T of input data stored in the respective backward processing modules is diminished. With the number n of the backward processing modules and with T=2B, the minimum value of the window determining the decoding characteristics is given by (n−1)B. Since the number of registers required by the backward value storage means 136 is proportionate to B, an error correction code decoding device with a smaller number of registers can be realized, without deteriorating decoding characteristics, by the device configuration with a larger value of n. In particular, in the device configuration of the present invention, in which the respective modules are interconnected by a simplified input/output relationship, designing may be made independently from module to module, with the result that the device can be designed easily even if n has a large value. Since the volume of the device of the backward processing modules is naturally increased with the value of n, the optimum n may be determined by compromising with respect to the decreased number of the registers.

In comparison with the conventional turbo decoding, in which decoding of the elementary code 1 and that of the elementary code 2 is sequentially iterated, the present invention provides for simultaneous decoding of the elementary codes 1 and 2, so that the processing time per one iteration is halved. Moreover, according to the present invention, soft-output generating processing is carried out using the already updated extrinsic information, even with one iteration, so that the number of times of iteration can be suppressed even if the elementary codes 1 and 2 are decoded simultaneously. If, in the device configuration shown in FIG. 1, the block length is on the order of one-tenth of the interleaving length of the turbo codes, the increased number of times of iteration of one iteration or less as compared to that in the conventional turbo decoding suffices in a majority of cases. If, in the case of the conventional decoding method, the number of times of iteration is 6, that of the present invention is 7. However, since the time required for one iteration is one half, the iterative decoding may be completed within a period of time corresponding to 3.5/6 (approximately 0.6) times that required in the conventional decoding method. That is, about 40% time saving may be realized with the present invention.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. An error correction code decoding apparatus for performing soft-output generating processing by executing forward processing and backward processing on a code trellis, based on received data and a priori information and by exploiting the values as calculated by said forward processing and backward processing, said apparatus comprising:
    a memory for storing received data;
    a memory for storing a priori information;
    a forward Processing module for performing forward processing;
    a soft-output generating module for generating soft-output; and
    a plurality of backward processing modules executing backward processing at different time points on the code trellis,
    wherein said backward processing module comprises updating, means for updating a backward value, storage, means for storing received data, storage means for storing a priori information and storage means, for storing the backward value;
    wherein input to said backward processing module is either said received data and said a priori information read in from said memory, or received data and a priori information stored in said received data storage means and said a priori information storage means, respectively, in another one of backward processing modules, said other one being predetermined per each of the backward processing modules;
    wherein said backward value storage means holds backward value generated value generated by said backward processing;
    wherein said backward value updating means updates the backward value, stored in said backward value storage means, using the received data and the a priori information as an input to said backward processing module; and
    wherein the received data and the a priori information are read in periodically from a memory in a reversed sequence;
    the received data and the a priori information read in from said memory, are provided as inputs to a selected backward processing module; and
    wherein the selected backward processing module receiving the received data and the a priori information read in from said memory as inputs is changed to another backward processing module for each period.

2. The error correction code decoding apparatus as defined in claim 1, wherein
    said backward processing, forward processing and soft-output generating processing are executed based on a maximum a posteriori probability decoding algorithm.

3. The error correction code decoding apparatus as defined in claim 1, wherein
    said backward processing, forward processing and soft-output generating processing are executed based on a Max-Log-MAP decoding algorithm.

4. An error correction code decoding apparatus for iterative decoding of error correction codes on which a plurality of a number of convolutional codes are concatenated in parallel via an interleaver;
    said apparatus comprising a plurality of soft-input and soft-output decoding means for decoding soft-input and soft-output corresponding to the convolutional codes, wherein
    said soft-input and soft-output decoding means allow local soft-input and soft-output;
    wherein said plurality of soft-input an soft-output decoding means operate in parallel;
    wherein a one of said plurality of soft-input and said soft-output decoding means uses a soft-output generated by another one of said plurality of soft-input and soft-output decoding means as a priori information; and wherein said soft-input and soft-output decoding means comprises a structure of said error correction code decoding apparatus as defined in claim 1.

5. The error correction code decoding apparatus as defined in claim 1, wherein said forward processing module and said soft-output generating module comprise forward value updating means for updating forward value, forward value storage means for storing forward value, received data storage means for storing received data, a priori information storage means for storing a priori information, backward value storage means for storing backward value and soft-output generating means for generating soft-output;

said received data, said a priori information and said backward value, as output from said backward processing module that inputs the received data and the a priori information from said memory, are held be said received data storage means, said a priori information storage means and said backward value storage means, respectively;

said forward value storage means holds a forward value generated by said forward processing;

said forward value updating means updates the forward value stored by said forward value storage means, using the received data and the a priori information; and said soft-output generating means generates soft-output using the forward value, the received data and the backward value.

6. The error correction code decoding apparatus as defined in claim 1, wherein said received data storage means and said a priori information storage means of said backward processing module hold data corresponding to twice a number of time intervals.

7. The error correction code decoding apparatus as defined in claim 6, wherein said received data is read in after calculating a branch metric and subsequently said shift register holds said branch metric such that the backward processing, forward processing and soft-output generating processing can be executed based on said branch metric.

* * * * *